(12) United States Patent
Kouwenhoven

(10) Patent No.: US 6,838,879 B2
(45) Date of Patent: Jan. 4, 2005

(54) MAGNETIC RESONANCE IMAGING METHOD FOR AN ANGULATED CUT PLANE WITH RESPECT TO A REFERENCE FRAME

(75) Inventor: Marc Kouwenhoven, Eindhoven (NL)

(73) Assignee: Koninklijke Philips Electronics N.V. (NL)

( * ) Notice: Subject to any disclaimer, the term of this patent is extended or adjusted under 35 U.S.C. 154(b) by 0 days.

(21) Appl. No.: 10/296,185
(22) PCT Filed: Mar. 19, 2002
(86) PCT No.: PCT/IB02/00901
§ 371 (c)(1),
(2), (4) Date: Nov. 21, 2002
(87) PCT Pub. No.: WO02/077659
PCT Pub. Date: Oct. 3, 2002

(65) Prior Publication Data
US 2003/0135104 A1 Jul. 17, 2003

(30) Foreign Application Priority Data
Mar. 23, 2001 (EP) .............................. 01201131

(51) Int. Cl.[7] ................................. G01V 3/00
(52) U.S. Cl. ....................................... 324/309
(58) Field of Search ............... 324/307, 309; 600/410; 382/276–307

(56) References Cited

U.S. PATENT DOCUMENTS

| | | | | |
|---|---|---|---|---|
| 4,618,978 A | * | 10/1986 | Cosman | 378/164 |
| 4,702,257 A | * | 10/1987 | Moriyama et al. | 600/425 |
| 4,710,716 A | * | 12/1987 | Keren et al. | 324/309 |
| 4,818,937 A | * | 4/1989 | Ailion et al. | 324/309 |
| 4,984,157 A | * | 1/1991 | Cline et al. | 345/424 |
| 5,005,578 A | * | 4/1991 | Greer et al. | 600/414 |
| 5,235,281 A | * | 8/1993 | Haragashira et al. | 324/318 |
| 5,371,778 A | * | 12/1994 | Yanof et al. | 378/4 |
| 5,500,594 A | * | 3/1996 | Leussler | 324/318 |
| 5,501,218 A | * | 3/1996 | Usui | 600/410 |
| 5,548,216 A | * | 8/1996 | Dumoulin et al. | 324/309 |
| 5,578,924 A | * | 11/1996 | Dumoulin et al. | 324/309 |
| 5,749,834 A | * | 5/1998 | Hushek | 600/410 |
| 5,786,692 A | * | 7/1998 | Maier et al. | 324/307 |
| 6,377,045 B1 | * | 4/2002 | Van Den Brink et al. | 324/307 |
| 6,476,607 B1 | * | 11/2002 | Dannels et al. | 324/309 |
| 6,490,477 B1 | * | 12/2002 | Zylka et al. | 600/429 |
| 6,541,971 B1 | * | 4/2003 | Dannels | 324/309 |

FOREIGN PATENT DOCUMENTS

| | | |
|---|---|---|
| WO | WO 98/21600 | 5/1998 |
| WO | WO 99/54746 | 10/1999 |
| WO | WO 00/33101 | 6/2000 |

* cited by examiner

Primary Examiner—Diego Gutierrez
Assistant Examiner—Dixomara Vargas
(74) Attorney, Agent, or Firm—Thomas M. Lundin

(57) ABSTRACT

At least one reference plane, but preferably three orthogonal reference planes (A, C, S) are defined in a magnetic resonance imaging method. A cut plane is chosen so as to extend at an angle to one (single oblique) (SO) or two (double oblique) (DO) of the reference planes. One side of the field of view within the cut plane remains parallel to one (of the) reference plane (planes). A cross-sectional magnetic resonance image along the cut plane is reconstructed from magnetic resonance signals.

6 Claims, 2 Drawing Sheets

Figure 1:
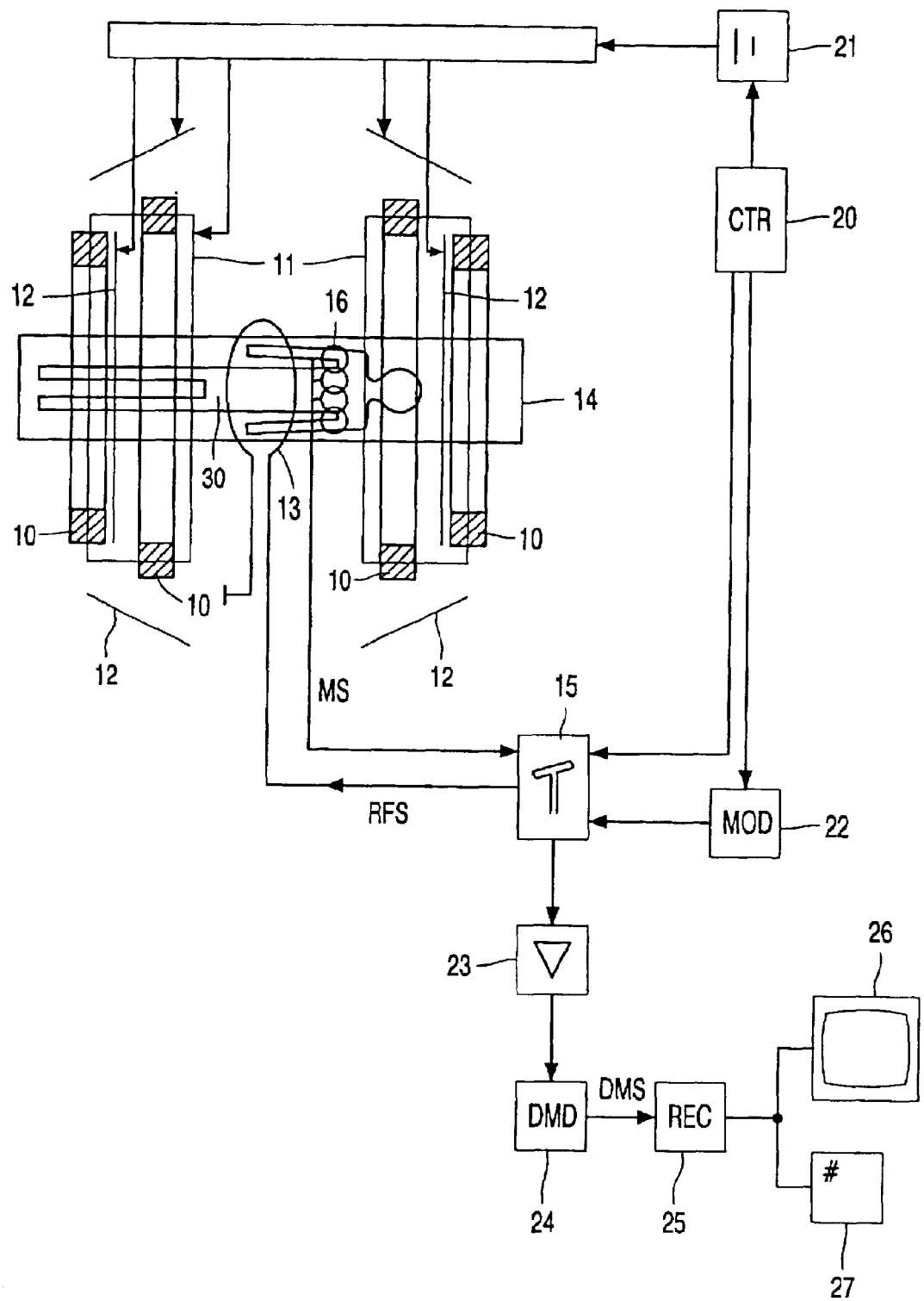

MAGNETIC RESONANCE IMAGING METHOD FOR AN ANGULATED CUT PLANE WITH RESPECT TO A REFERENCE FRAME

BACKGROUND

The invention relates to a magnetic resonance imaging method in which a cross-sectional image along a cut plane is derived from acquired magnetic resonance signals.

A magnetic resonance imaging method of this kind is known from international application WO 00/33101.

The known magnetic resonance imaging method involves the formation of a number of cross-sectional images of an object to be examined. The cut plane is defined on the basis of three points indicated by the user in separate cross-sectional images and a cross-sectional image is formed along the cut plane through the object to be examined.

It is a drawback of the known magnetic resonance imaging method that artefacts (so-called back-folding artefacts) often occur in the cross-sectional image, because parts of the object to be examined (for example, the patient) extend beyond the field of view in the cut plane.

SUMMARY

It is an object of the invention to provide a magnetic resonance imaging method which offers the user as much freedom as possible in adjusting the cut plane and in which the cross-section of the object along the selected cut plane remains better within the field of view used.

This object is achieved by means of a magnetic resonance imaging method in accordance with the invention, in which:

at least one reference plane is defined,
a cut plane is chosen at an angle relative to the reference plane, one side of said cut plane extending parallel to the reference plane,
magnetic resonance signals are received, and
a cross-sectional image of a cross-section along the cut plane is reconstructed from the magnetic resonance signals.

The reference plane used in conformity with the invention preferably is a plane extending along a major axis of the object to be examined. Using the magnetic resonance imaging method, magnetic resonance signals are acquired and one or more magnetic resonance images of an object to be imaged are reconstructed therefrom. When the magnetic resonance imaging method in accordance with the invention is used to form a medical diagnostic magnetic resonance image of a patient to be examined, the reference plane is, for example, an axial or transversal plane extending perpendicularly to the foot-head axis, a sagittal plane extending perpendicularly to the left-right axis, or a coronal plane extending perpendicularly to the anterior-posterior axis. The cut plane need not extend parallel to such a reference plane. The cross-sectional image represents a cross-section through the object to be examined (for example, the patient to be examined) along the cut plane. A cut plane of this kind which encloses an angle unequal to 90° relative to one of the feasible reference planes is also referred to as a "single oblique" cut plane. A cut plane of this kind which encloses an angle unequal to 90° relative to two of the feasible reference planes is also referred to as a "double oblique" cut plane. The smallest wave number of the acquired magnetic resonance signals, that is, the greatest wavelength, determines the field of view in relation to the magnetic resonance imaging method used. The field of view within the cut plane is effectively limited and is dependent on the settings of the magnetic resonance imaging system as chosen by the user. In conformity with the invention one side of the field of view within the cut plane is parallel to the selected reference plane. For the selected orientation of the cut plane, in accordance with the invention the rotation in the cut plane of the field of view within the cut plane is chosen to be such that one side extends parallel to the relevant reference plane. The magnitude of the object to be examined along the cut plane relative to the field of view is thus taken into account better for the magnetic resonance imaging method used. Moreover, one side of the field of view within the cut plane can always be kept parallel to the relevant reference plane when the orientation of the cut plane is varied. Consequently, hardly any artefacts occur when the orientation of the cut plane changes.

It is notably avoided that the object to be examined extends partly outside the field of view. It is notably when the reference plane is situated in the direction of a major axis of the object to be examined that the field of view within the cut plane can be rotated in such a manner that one side of the field of view remains parallel to the reference plane, thus avoiding the situation where the object extends beyond the field of view. The field of view is often a rectangle having a long side and a short side. When this rectangle is oriented in the plane of the cut plane, the shape of the object to be examined is taken into account. The long side preferably extends in a direction in which the object to be examined has a larger dimension while the short side is situated in a direction in which the object has a smaller dimension. It can thus be ensured that no or hardly any magnetic resonance signals are received from outside the field of view in the cut plane. Because one side of the field of view within the cut plane extends parallel to the reference plane, the relationship between the shape of the field of view and the shape of the object to be examined is maintained when the angle of the cut plane relative to the reference plane is changed. Artefacts due to back-folding phenomena are thus avoided in the cross-sectional image. Such back-folding phenomena occur when the object to be examined extends outside the field of view. Back-folding phenomena are also referred to as aliasing artefacts. On the other hand, the condition that one side of the field of view within the cut plane should remain parallel to the reference plane does not impose any practical limitations as regards the orientation of the cut plane.

Generally speaking, the magnetic resonance imaging method in accordance with the invention can be used for all kinds of diagnostic examinations utilizing magnetic resonance images, but is particularly suitable for use in cardiology. For a study of the heart of the patient to be examined preferably double oblique cross-sectional images are formed, because the major axes of the heart enclose an angle relative to the major axes of the body as a whole. The cross-sectional images formed in accordance with the invention have a very natural orientation and hence can be readily diagnostically interpreted.

These and other aspects of the invention will be further elaborated on the basis of the following embodiments.

Particularly attractive results are achieved when double oblique cross-sectional images are used. The cut plane then encloses an angle relative to two previously selected orthogonal reference planes and one side of the cut plane remains parallel to the third reference plane which is orthogonal to the other two reference planes. When the transversal plane, the sagittal plane and the coronal plane are selected as the three orthogonal reference planes, the cross-sectional image will have quite a natural orientation in practically all orientations of the cut plane.

Furthermore, survey images of cross-sections along the one or more reference planes can be made in advance. Such survey images are reconstructed from magnetic resonance signals in conformity with magnetic resonance imaging methods which are known per se. The survey images constitute a useful tool for adjusting the angle of the cut plane relative to two of the reference planes so as to form a cross-sectional image containing as much diagnostically relevant information as possible.

The invention is advantageously suitable for use in combination with magnetic resonance imaging methods in which sub-sampling is applied in one or more directions in the k space and reconstruction is carried out on the basis of the spatial coil sensitivity profile. The sub-sampling reduces the field of view in the direction (directions) in the magnetic resonance image which corresponds (correspond) to the direction (directions) in the k space in which the sub-sampling takes place. The magnetic resonance imaging method in accordance with the invention ensures that the cut plane remains within the non-reduced field of view as well as possible, thus avoiding unintended back-folding phenomena. The cross-sectional image can thus be reconstructed along the cut plane on the basis of the coil sensitivity profile and the sub-sampled magnetic resonance signals. The invention is notably suitable for use in conjunction with sub-sampling techniques such as SENSE, because SENSE is based on the assumption that no signal arrives from outside the planned (reconstructed) field of view. Because of the orientation of the field of view in the cut plane as chosen in accordance with the invention, aliasing artefacts will occur after the SENSE reconstruction; these artefacts will appear in very undesirable locations (for example, at the center) in the ultimate image, that is, in dependence on the SENSE factor. The proposed invention will minimize the risk of aliasing artefacts.

Various reconstruction methods are available for the reconstruction of the cross-sectional image from the sub-sampled magnetic resonance signals, said reconstruction methods utilizing the spatial coil sensitivity profile in order to recover the brightness values of the cross-sectional image from the deliberately induced aliasing phenomena.

Sub-sampling reduces the period of time necessary to acquire the magnetic resonance images. In the case of sub-sampling, the number or the density of the sampled positions in the k space is reduced. The magnetic resonance signals are acquired via various signal channels, each of which is linked to a receiving antenna, such as a receiving coil which is preferably a surface coil.

Because of the sub-sampling, the sampled data contain contributions from individual spatial positions of the object to be examined. The magnetic resonance image is reconstructed from the sub-sampled magnetic resonance signals while utilizing a sensitivity profile which is associated with the signal channels. More specifically, the sensitivity profile is, for example, the spatial coil sensitivity profiles of the receiving antennas such as the receiving coils. Preferably, surface coils are used as the receiving coils. The reconstructed magnetic resonance image may be considered to be composed of a large number of spatial harmonic components which are associated with brightness variations and contrast variations having an individual wavelength. The spatial resolution of the magnetic resonance image is determined by the smallest wavelength, that is, by the largest wave number (k value). The largest wavelength, so the smallest wave number, defines the magnitude of the field of view of the magnetic resonance image. Therefore, the spatial resolution is determined by the ratio of the field of view to the number of samples.

Sub-sampling can be performed in that the receiving antennas pick up magnetic resonance signals while the resolution in the k space is coarser than necessary for the spatial resolution of the magnetic resonance image. The smallest sampled wave number, being the smallest sampling step in the k space, is increased while the largest sampled wave number remains the same. In the case of sub-sampling the spatial resolution thus remains the same but the field of view becomes smaller because the minimum step in the k space becomes smaller. Because of this reduction of the field of view, the sampled data contain contributions from different positions in the object to be examined.

The sub-sampling is performed, for example, by reducing the sampling density in the k space, for example by skipping lines during the sampling of lines in the k space, so that the sampled lines in the k space are situated apart further than necessary for the spatial resolution of the magnetic resonance image.

Receiving coil images reconstructed from sub-sampled magnetic resonance signals from respective receiving coils in particular contain aliasing artefacts due to the reduced field of view. Using the coil sensitivity profile, the contributions from different positions in the magnetic resonance image are separated from said receiving coil images and the magnetic resonance image is reconstructed therefrom. This magnetic resonance imaging method is known by the acronym SENSE technique. This SENSE technique is disclosed in greater detail in the international application WO 99/54746.

The sub-sampled magnetic resonance signals can also be combined on the basis of the coil sensitivity profile so as to form composite magnetic resonance signals which represent complete sampling for the relevant field of view. More specifically, in conformity with this so-called SMASH technique the sub-sampled magnetic resonance signals approximate low-order spherical harmonic components of the magnetic resonance image. The cited SMASH technique is disclosed in greater detail in the international application WO 98/21600.

Sub-sampling can also be performed in space. In that case the spatial resolution of the magnetic resonance signals received is less than the spatial resolution of the magnetic resonance image. The magnetic resonance signals associated with the spatial resolution of the magnetic resonance image are formed from the received magnetic resonance signals, that is, on the basis of the coil sensitivity profile. Spatial sub-sampling is performed notably in that magnetic resonance signals are composed, via different signal channels, for example, of different receiving coils, from separate parts of the object to be imaged. Such separate parts are, for example, individually RF excited slices of the object to be imaged. The magnetic resonance signals received via separate signal channels often form linear combinations of individual parts, for example, individual slices. This linear combination involves the spatial coil sensitivity profile of the receiving coils. This means that the magnetic resonance signals received via individual signal channels are linked to magnetic resonance signals for individual parts, for example, slices of the object to be imaged, by way of a sensitivity matrix. This sensitivity matrix represents the weights of the contributions due to the coil sensitivity profile of the individual parts of the object to be examined to the individual signal channels. Magnetic resonance signals for the respective parts of the object to be examined are derived from the received spatially sub-sampled magnetic resonance signals when the sensitivity matrix is inverted. Magnetic resonance images of the individual slices are formed in particular.

The invention also relates to a magnetic resonance imaging system. The magnetic resonance imaging system in accordance with the invention is arranged to carry out the magnetic resonance imaging method in accordance with the invention. The invention also relates to a computer program which enables a magnetic resonance imaging system to carry out the magnetic resonance imaging method in accordance with the invention. The computer program in accordance with the invention can be loaded into the working memory of a magnetic resonance imaging system. For example, the computer program may be available on a data carrier such as a CD-rom disc; it is also possible to download the computer program from a network such as the worldwide web. The magnetic resonance imaging system is also arranged to receive magnetic resonance signals and to perform a reconstruction. Generally speaking, magnetic resonance imaging systems are provided with receiving antennas and electronic circuits, such as a transmission and receiving circuit, whereby magnetic resonance signals can be received, that is, independently from the invention. Furthermore, a magnetic resonance imaging system is also arranged, generally speaking, to reconstruct a magnetic resonance image from the magnetic resonance signals. When the computer program in accordance with the invention is loaded, therefore, it will generally not be necessary to load separate instructions for the reception of magnetic resonance signals and the reconstruction of the magnetic resonance image.

DRAWINGS

Figure 2:
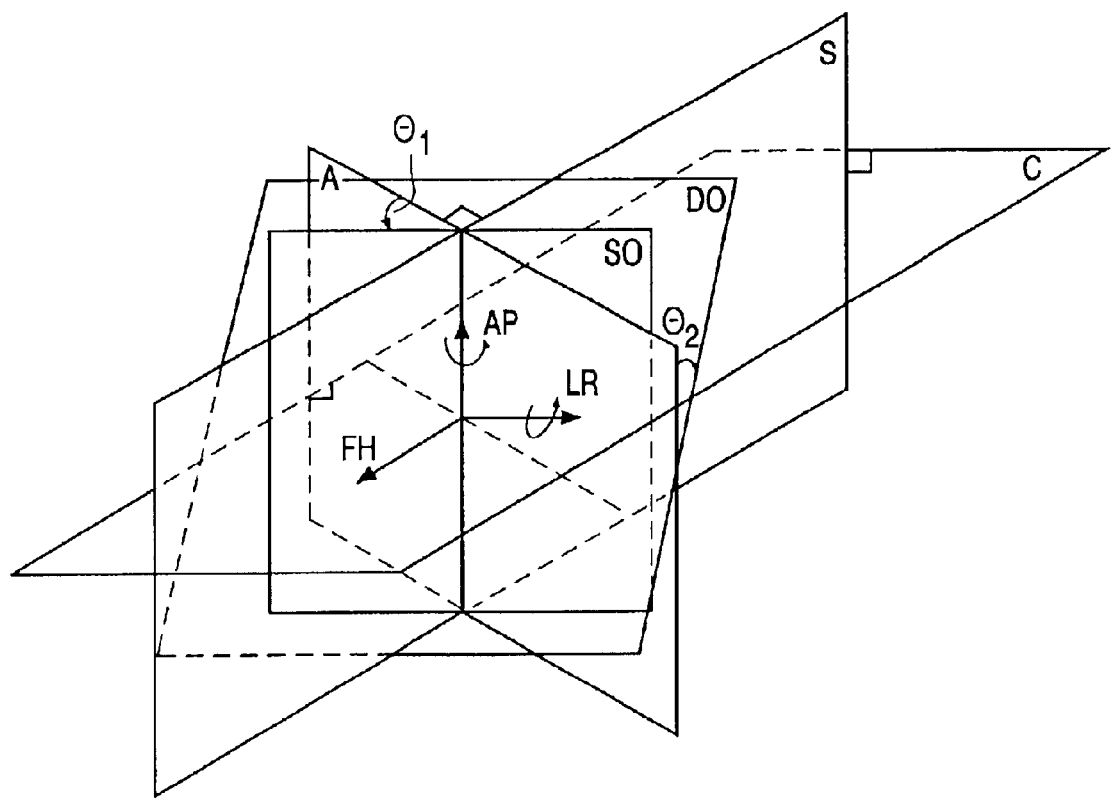

These and other aspects of the invention will be described in detail hereinafter, by way of example, on the basis of the following embodiments and with reference to the accompanying drawing; therein:

FIG. 1 is a diagrammatic representation of a magnetic resonance imaging system in which the invention is used, and FIG. 2 is a diagram illustrating the orientations of the orthogonal reference planes and the cut plane as used in conformity with the invention.

DESCRIPTION

FIG. 1 is a diagrammatic representation of a magnetic resonance imaging system in which the invention is used. The magnetic resonance imaging system is provided with a system of main coils 10 whereby the steady, uniform magnetic field is generated.

The main coils are constructed, for example, in such a manner that they enclose a tunnel-shaped examination space. The patient to be examined is transported into said tunnel-shaped examination space. The magnetic resonance imaging system also includes a number of gradients coils 11, 12 whereby magnetic fields containing spatial variations, notably in the form of temporary gradients in individual directions, are superposed on the uniform magnetic field. The gradient coils 11, 12 are connected to a controllable power supply unit 21. The gradient coils 11, 12 are energized by applying an electric current thereto by way of the power supply unit 21. The strength, the direction and the duration of the gradients are controlled by control of the power supply unit. The magnetic resonance imaging system also includes transmission and receiving coils 13, 15 for generating the RF excitation pulses and for picking up the magnetic resonance signals, respectively. The RF excitation pulses excite (nuclear) spins in the object to be examined, or the patient to be examined, in the steady magnetic field. Subsequently, relaxation of the excited (nuclear) spins occurs, magnetic resonance signals thus being emitted. The magnetic resonance signals may be free induction decay or FID signals, but it is also possible to generate magnetic resonance echoes. It is notably possible to generate spin echo signals by using refocusing RF pulses. Furthermore, gradient echo signals can be generated by application of temporary gradient fields. Application of the temporary gradient fields provides spatial encoding of the magnetic resonance signals. The transmission coil 13 is preferably constructed as a body coil 13 which is suitable to enclose (a part of) the object to be examined. The body coil is usually arranged in the magnetic resonance imaging system in such a manner that the patient 30 to be examined is situated within the body coil 13 when positioned in the magnetic resonance imaging system. The body coil 13 operates as a transmission antenna for the emission of the RF excitation pulses and of RF refocusing pulses. The RF pulses emitted by the body coil 13 preferably have a spatially uniform intensity distribution. Usually the same coil or antenna is used alternately as a transmission coil and a receiving coil. Furthermore, the transmission and receiving coil is usually formed as a coil, but other geometries where the transmission and receiving coil acts as a transmission and receiving antenna for RF electromagnetic signals are also feasible. The transmission and receiving coil 13 is connected to an electronic transmission and receiving circuit 15.

However, it is also possible to use separate receiving coils. For example, surface coils can be used as receiving coils. Such surface coils have a high sensitivity in a comparatively small spatial volume. The transmission coils, such as the surface coils, are connected to a demodulator 24 and the magnetic resonance signals received (RFS) are demodulated by the demodulator 24. The demodulated magnetic resonance signals (DMS) are applied to a reconstruction unit. The receiving coil is connected to a preamplifier 23. The preamplifier 23 amplifies the RF resonance signal (RFS) received by the receiving coil and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission/receiving circuit 15 activate the transmission coil 13 so as to emit the RF excitation and refocusing pulses. The reconstruction unit derives from the demodulated magnetic resonance signals (DMS) one or more image signals which represent the image information of the imaged part of the object to be examined, in this case being the cross-sectional image along the cut plane, but cross-sectional images along the orthogonal reference planes are also possible. The reconstruction unit 25 in practice is constructed preferably as a digital image processing unit 25 which is programmed to derive from the demodulated magnetic resonance signals the image signals which represent the image information of the part of the object to be imaged. The signal on the output of the reconstruction unit is applied to a monitor 26, so that the three-dimensional density distribution or the spectroscopic information can be displayed on the monitor. It is alternatively possible to store the signal from the reconstruction unit in a buffer unit 27 while awaiting further processing.

FIG. 2 shows a diagram illustrating the orientations of the orthogonal reference plane and the cut plane as used in accordance with the invention. The reference planes are the axial (or transversal) plane A which extends perpendicularly to the foot-head direction (FH), the coronal plane C which extends perpendicularly to the anterior-posterior direction (AP), and the sagittal plane S which extends perpendicularly to the left-right direction (LR). For the purpose of illustration the Figure shows a single oblique cut plane (SO) which has been rotated through an angle θ1 around the AP direction. There is also shown a double oblique cut plane (DO) which has been rotated through an angle θ1 around the AP direction and through an angle θ2 around the LR direction. In both cases one side of the cut plane (SO and DO) extends parallel to the third reference plane, in this case being the coronal plane C.

What is claimed is:

1. A magnetic resonance imaging method comprising the steps of:
    defining at least one reference plane,
    choosing a cut plane at at least one angle relative to the reference plane or planes,
    maintaining one side of said cut plane extending parallel to the reference plane,
    receiving magnetic resonance signals, and reconstructing a cross-sectional image of a cross-section along the cut plane from the magnetic resonance signals in which
    a plurality of orthogonal reference planes is defined, notably three reference planes, and
    the cut plane is chosen so as to extend at respective angles relative to at least two of the orthogonal reference planes while one side of the cut plane extends parallel to the third reference plane.

2. A magnetic resonance imaging method as claimed in claim 1, in which
    the magnetic resonance signals are acquired by means of a system of one or more receiving coils having a spatial coil sensitivity profile,
    the magnetic resonance signals are required while applying sub-sampling, and
    the cross-sectional image is reconstructed on the basis of the sub-sampled magnetic resonance signal and the spatial coil sensitivity profile.

3. A magnetic resonance imaging method as claimed in claim 2, in which
    receiving coil images are reconstructed from sub-sampled magnetic resonance signals acquired by means of individual receiving coils, and
    the cross-sectional image is derived from the receiving coil images on the basis of the spatial coil sensitivity profile.

4. A magnetic resonance imaging method as claimed in claim 2, in which the sub-sampling occurs along one or more phase encoding directions and the reading direction extends parallel to the side of the cut plane which extends parallel to the reference plane.

5. A magnetic resonance imaging system comprising:
    means for defining at least one reference plane,
    means for selecting a cut plane at at least one angle relative to the reference plane or planes, one side of said cut plane extending parallel to the reference plane,
    means for receiving magnetic resonance signals, and means for reconstructing a cross-sectional image of a cross-section along the cut plane from the magnetic resonance signals wherein:
    a plurality of orthogonal reference planes is defined, notably three reference planes, and
    the cut plane is chosen so as to extend at respective angles relative to at least two of the orthogonal reference planes while one side of the cut nine extends parallel to the third reference plane.

6. A computer readable media comprising a computer program which includes instructions for
    defining at least one reference plane, and
    for selecting a cut plane at an angle relative to the reference plane, one side of said cut plane extending parallel to the reference plane; and
    defining a plurality of orthogonal reference planes, notably three reference planes, and
    choosing the cut plane so as to extend at respective angeles relative to at least two of the orthogonal reference planes while one side of the cut plane extends parallel to the third reference plane.

* * * * *